(12) United States Patent
Tachibana

(10) Patent No.: US 8,273,586 B2
(45) Date of Patent: Sep. 25, 2012

(54) LIGHT EMITTING DEVICE AND MANUFACTURING METHOD THEREOF

(75) Inventor: Kaori Tachibana, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 221 days.

(21) Appl. No.: 12/816,893

(22) Filed: Jun. 16, 2010

(65) Prior Publication Data

US 2010/0320482 A1    Dec. 23, 2010

(30) Foreign Application Priority Data

Jun. 18, 2009    (JP) ................................ 2009-145254

(51) Int. Cl.
*H01L 21/00*    (2006.01)
(52) U.S. Cl. ............ 438/26; 438/112; 438/458; 257/81; 257/98; 257/E21.499
(58) Field of Classification Search .................... 438/22, 438/25, 26, 28, 112, 118, 458; 257/79, 80, 257/81, 88, 98, 99, 100, 787–795, E21.499, 257/E21.502, E33.001, E33.056–E33.059
See application file for complete search history.

(56) References Cited

U.S. PATENT DOCUMENTS

2009/0103005 A1* 4/2009 Nakazato et al. ............... 349/62

FOREIGN PATENT DOCUMENTS

| JP | 11-340517 A | 12/1999 |
| JP | 2004-241509 A | 8/2004 |
| JP | 2006-245626 A | 9/2006 |

* cited by examiner

*Primary Examiner* — Julio J Maldonado
*Assistant Examiner* — Sonya McCall Shepard
(74) *Attorney, Agent, or Firm* — Kenealy Vaidya LLP

(57) ABSTRACT

A light emitting device comprises a substrate having a plurality of light emitting elements mounted thereon; a side wall structure having a partition wall portion separating a plurality of light emitting areas that each include at least one of the light emitting elements; and encapsulating resin filled in the light emitting areas to bury the light emitting elements therein. The side wall structure is separated by a space from the substrate at, at least, the partition wall portion so as to be in noncontact with the substrate, and the encapsulating resin is formed so as to integrally, continuously fill the light emitting areas and the space without producing any interface therein.

6 Claims, 11 Drawing Sheets

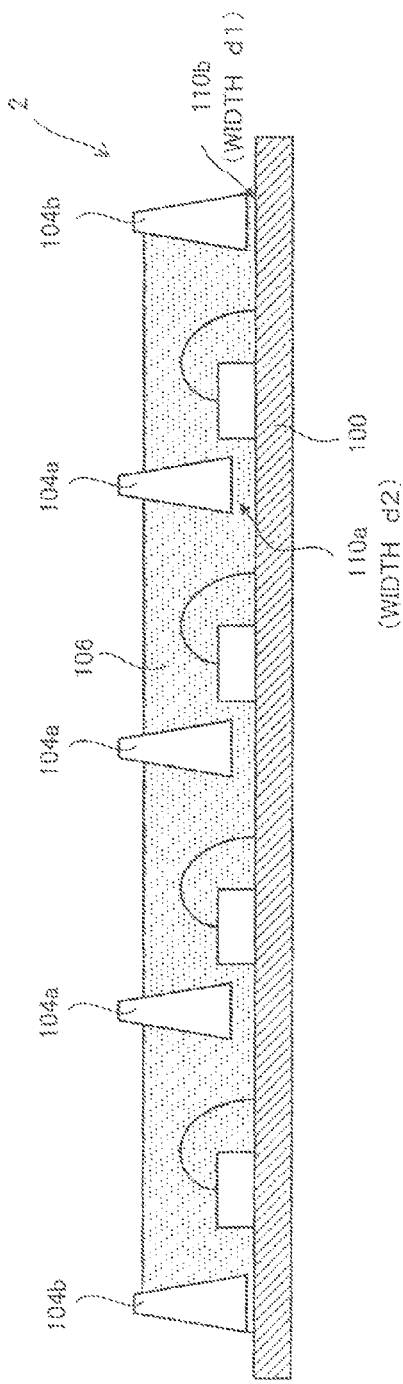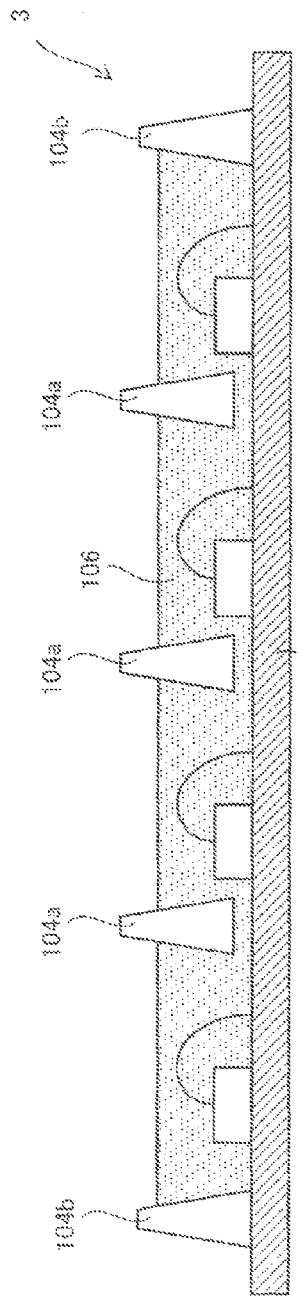

LIGHT EMITTING DEVICE AND MANUFACTURING METHOD THEREOF

This application claims the priority benefit under 35 U.S.C. §119 of Japanese Patent Application No. 2009-145254 filed on Jun. 18, 2009, which is hereby incorporated in its entirety by reference.

BACKGROUND OF THE INVENTION

1. Field of the Invention

The present invention relates to a light emitting device including a semiconductor light emitting element such as a light emitting diode (LED) and a manufacturing method thereof.

2. Description of the Related Art

Conventional examples of the configuration of a light emitting device, including a substrate having an LED chip mounted thereon and a reflector provided separately from the substrate, are as follows.

Japanese Patent Application Laid-Open Publication No. H11-340517 discloses the configuration of a semiconductor light emitting device wherein a ring-shaped reflector is fixed onto a substrate to surround a semiconductor light emitting element, and wherein the reflector and the semiconductor light emitting element are buried with encapsulating resin.

Japanese Patent Application Laid-Open Publication No. 2004-241509 discloses the configuration of an LED light source which includes a printed substrate having a plurality of LED chips mounted thereon and a conductor pattern for connecting the LED chips formed thereon, a reflector plate having reflector holes provided corresponding to the LED chips, which plate is stuck at its underside to the printed substrate via an adhesive layer, and encapsulating resin filling the reflector holes.

Japanese Patent Application Laid-Open Publication No. 2006-245626 discloses a light emitting diode device which is produced by mounting multiple LED elements at predetermined positions on a substrate and performing wire-bonding and then sticking a reflector frame provided with multiple holes corresponding to the mounting positions of the LED elements arranged on the substrate, onto the substrate and injecting light-transmissive resin to fill the holes provided in the reflector frame and dicing along cutting lines into devices.

Where in the manufacturing process of light emitting devices, an adhesive is used to fix a reflector onto a substrate having an LED chip mounted thereon, the amount of applied adhesive needs to be finely managed. For example, if the amount of adhesive is too large, the adhesive will stick out of the footprint of the reflector and may be in contact with a bonding wire. This results in the bonding wire passing through the interface between the adhesive and encapsulating resin, and hence if the difference in thermal expansion coefficient between the adhesive and the encapsulating resin is large, the breaking of the bonding wire may happen due to a thermal shock, or so on, thus damaging reliability. Even if the encapsulating resin and the adhesive are of the same material, the interface will be formed as long as these are formed at different steps. If peeling-off happens at the interface to the resin layer, in addition to the possibility of wire breaking, light may be reflected or scattered at the peeled-off portion, causing a problem in terms of light distribution design.

On the other hand, if the amount of adhesive is not enough, a space will be produced between the substrate and the reflector, so that air is likely to get confined between the reflector and the substrate when injecting resin. Then, the air introduced under the reflector may intrude into the light emitting area to remain as a bubble in the encapsulating resin, which causes the reflection or scattering of light and thus failure in achieving intended light distribution. Further, if a bubble exists in the encapsulating resin, the bubble may become the starting point of a crack when a thermal shock is applied. Further, if the bubble is in contact with a bonding wire, it may cause wire breaking. Yet further, if variation in the amount of applied adhesive occurs, where the encapsulating resin contains a fluorescence substance, the height of the encapsulating resin will be uneven, which causes chromaticity deviation of emission color. Especially, where a planar light source or a linear light source is configured with a plurality of light emitting elements, this causes color unevenness, and hence variation in the amount of applied adhesive has been a factor in worsening the yield.

SUMMARY OF THE INVENTION

The present invention was made in view of the above facts, and an object thereof is to provide a light emitting device and a manufacturing method thereof which can improve reliability and manufacturing yield and reduce production cost, the light emitting device including a substrate having a light emitting element mounted thereon and a reflector.

According to an aspect of the invention, fixing a reflector onto a substrate and the injection of encapsulating resin are performed in one step, the number of production steps to be managed will be reduced, and thus production cost can be suppressed.

According to an aspect of the present invention, there is provide a light emitting device which includes a substrate having a plurality of light emitting elements mounted thereon; a side wall structure having a partition wall portion separating a plurality of light emitting areas that each include at least one of the light emitting elements; and encapsulating resin filled in the light emitting areas to bury the light emitting elements therein. The side wall structure is separated by a space from the substrate at, at least, the partition wall portion so as to be in noncontact with the substrate, and the encapsulating resin is formed so as to integrally, continuously fill the light emitting areas and the space without producing any interface therein.

A light emitting device according to another aspect of the present invention comprises a substrate having a light emitting element mounted thereon; encapsulating resin filled in a light emitting area to bury the light emitting element in; and side walls formed on side surfaces of the encapsulating resin so as to be separated by a space from the substrate at their entire bottom to be in noncontact with the substrate. The encapsulating resin is formed so as to integrally, continuously fill the light emitting areas and the space without producing any interface therein.

A manufacturing method of a light emitting device according to the present invention comprises a mounting step of mounting a plurality of light emitting elements on a substrate; a supporting step of supporting a side wall structure having a partition wall portion separating a plurality of light emitting areas at a predetermined relative position with respect to the substrate, each of the plurality of light emitting areas including at least one of the light emitting elements; and an encapsulating step of injecting encapsulating resin into the light emitting areas defined by the side wall structure to encapsulate the light emitting elements therein and to fix the side wall structure onto the substrate. In the supporting step, the side wall structure is supported such that the partition wall portion is separated by a space from the substrate, and in the encapsulating step, the encapsulating resin is injected to fill the space between the partition wall portion and the substrate, and each of the light emitting areas.

A manufacturing method of a light emitting device according to another aspect of the present invention comprises a mounting step of mounting a light emitting element on a substrate; a step of supporting a side wall structure that surrounds the light emitting element to be separated by a space from the substrate; and a step of injecting encapsulating resin into the inside of the side wall structure to cover the light emitting element and to fill the space between the bottom of the side wall structure and the substrate and curing the resin.

With the light emitting device and the manufacturing method thereof according to the present invention, the reliability and manufacturing yield of the light emitting device can be improved, and in addition, production cost can be reduced.

BRIEF DESCRIPTION OF THE DRAWINGS

FIG. 7 is a cross-sectional view showing the configuration of a light emitting device according to a second embodiment of the present invention;

FIG. 8 is a cross-sectional view showing the configuration of a light emitting device according to a third embodiment of the present invention;

DETAILED DESCRIPTION OF THE INVENTION

Figure 1A:
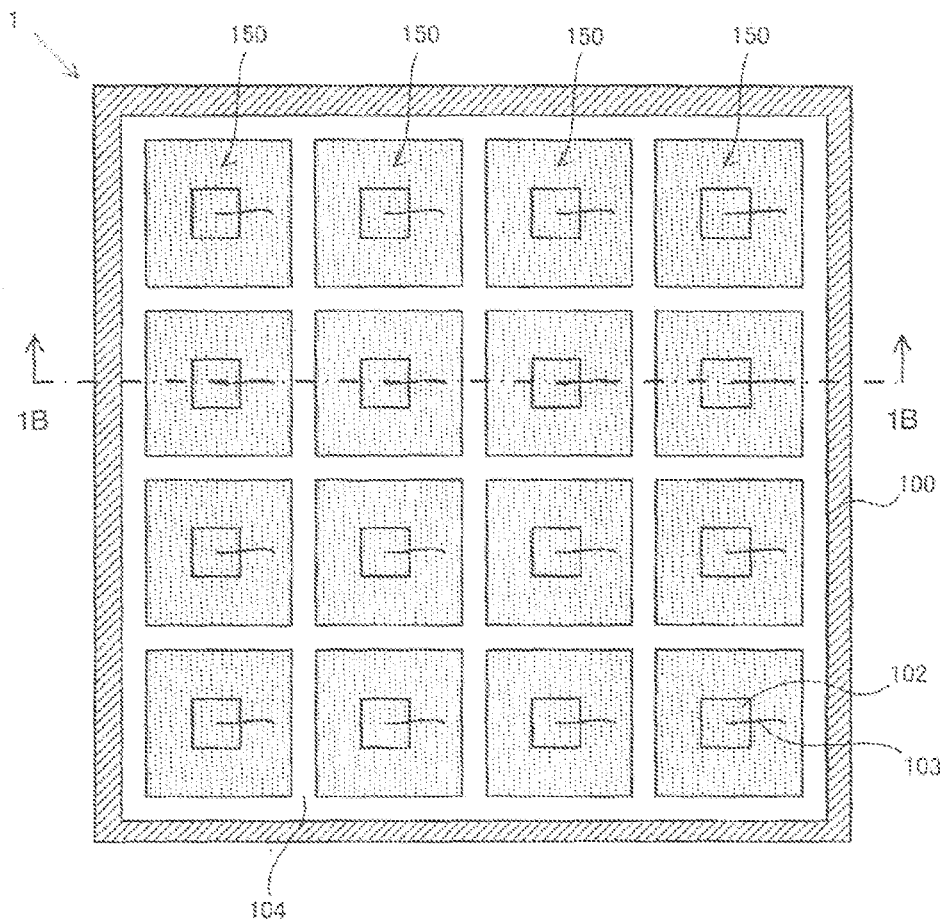
FIG. 1A is a top view of a light emitting device according to a first embodiment of the present invention.

Embodiments of the present invention will be described below with reference to the drawings. In the figures cited below, the same reference numerals are used to denote substantially the same or equivalent constituents or parts.

First Embodiment

Figure 1B:
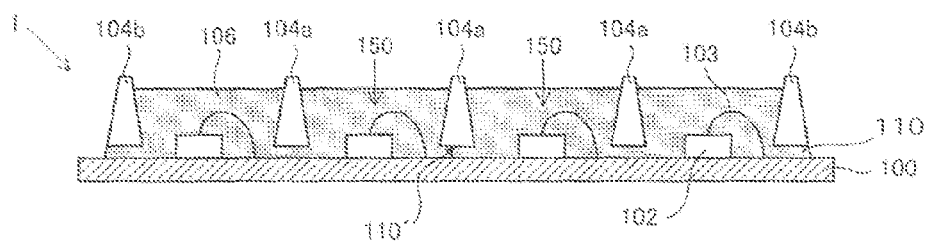
FIG. 1B is a cross-sectional view taken along line 1B-1B of FIG. 1A.

FIG. 1A is a top view showing the configuration of a light emitting device 1 according to a first embodiment of the present invention, and FIG. 1B is a cross-sectional view taken along line 1B-1B of FIG. 1A.

A substrate 100 is made of, e.g., glass epoxy resin or the like, and conductor lines (not shown) are formed on a surface of the substrate to feed power to a plurality of LED chips 102. For example, where the light emitting device 1 is used in application to a planar light source or a linear light source, a wiring pattern of conductor lines is formed to connect the LED chips 102 in series, in parallel, or in a combination of series and parallel. Note that the substrate 100 may be a metal substrate or a ceramic substrate instead of the resin substrate.

The plurality of LED chips 102 are fixed by a resin-based adhesive, solder, or the like at predetermined positions on the substrate 100. The LED chips 102 are arranged in rows and columns on the substrate 100. Each of the LED chips 102 is connected via a bonding wire 103 to a conductor line (not shown) on the substrate 100. Note that in the connection between each LED chip 102 and the substrate 100, both the anode and the cathode may be connected via bonding wires, or that the LED chip 102 may be provided at its rear side with a bump and flip-chip connected. Further, the emission wavelength of the LED chip 102 can be any wavelength in the range of infrared to ultraviolet.

Figure 2:
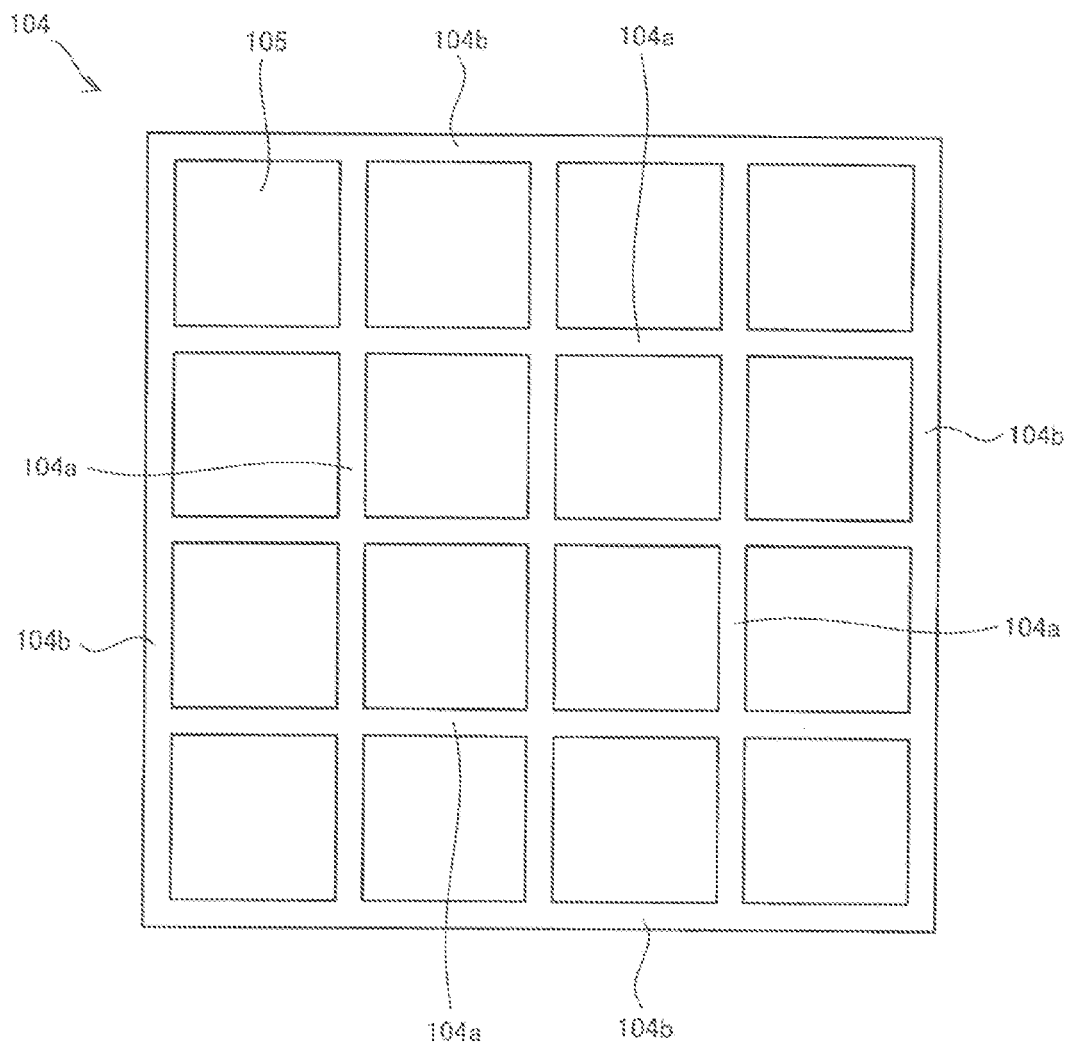
FIG. 2 is a plan view showing the structure of a reflector forming part of the light emitting device according to the embodiment of the present invention.

FIG. 2 is a plan view showing the configuration of a reflector 104 provided on the substrate 100. The reflector 104 is made of light-reflective material such as resin containing white powder, ceramic, or metal and has a plurality of openings 105 corresponding to the mounting positions of the LED chips 102 provided on the substrate 100. The reflector 104 comprises a partition wall portion 104a separating the plurality of LED chips 102, thus defining light emitting areas 150, and an outer edge portion 104b provided around the outside of the light emitting areas 150 and forming the outer edge of the reflector. The partition wall portion 104a of the reflector 104 is shaped like a lattice corresponding to the arrangement of the LED chips 102. The reflector 104 is configured such that each of the light emitting areas 150 is surrounded by parts of the partition wall portion 104a and the outer edge portion 104b. Both the partition wall portion 104a and the outer edge portion 104b of the reflector 104 are apart from the substrate 100, and spaces 110' between the substrate 100 and the reflector 104 are filled with encapsulating resin 106. Note that two or more LED chips may be included in each light emitting area 150 partitioned by the partition wall portion 104a.

The encapsulating resin 106 is made of light-transmissive resin such as epoxy resin, silicone resin, or urethane resin and is provided to bury the LED chip 102 in each light emitting area 150 defined by the reflector 104. The encapsulating resin 106 not only encapsulates each LED chip 102 but also serves as a bonding material to fix the reflector 104 onto the substrate 100. The encapsulating resin 106 is formed uniformly across portion filling the light emitting areas 150 and portion filling the spaces 110' between the substrate 100 and the reflector 104. That is, the encapsulating resin 106 is formed integrally, continuously filling the light emitting areas 150 and the spaces 110' without producing the any interface in both. Stated another way, the encapsulating resin 106 is formed uniformly or homogeneously within the entire region of the light emitting area 150 and the space 110'. Specifically, the encapsulating resin 106 is formed uniformly in its entirety so as not to produce any interface or boundary plane which may cause an optical reflection, diffraction, scattering and the like and/or a thermal stress. Note that the encapsulating resin 106 may contain a fluorescence substance or a scattering material.

Figure 3A:
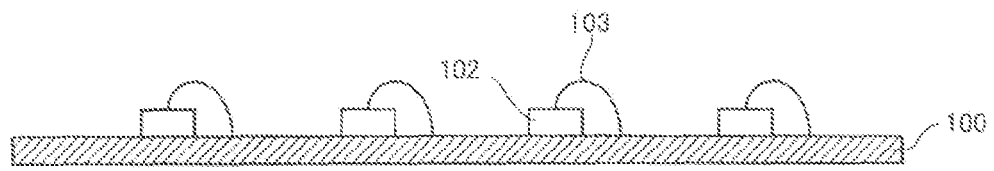
FIGS. 3A to 3C are cross-sectional views showing a manufacturing method of the light emitting device according to the embodiment of the present invention.
Figure 3B:
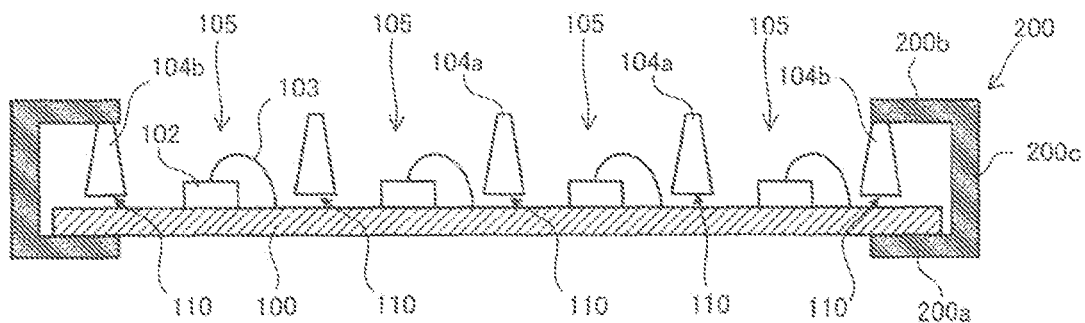
Figure 3C:
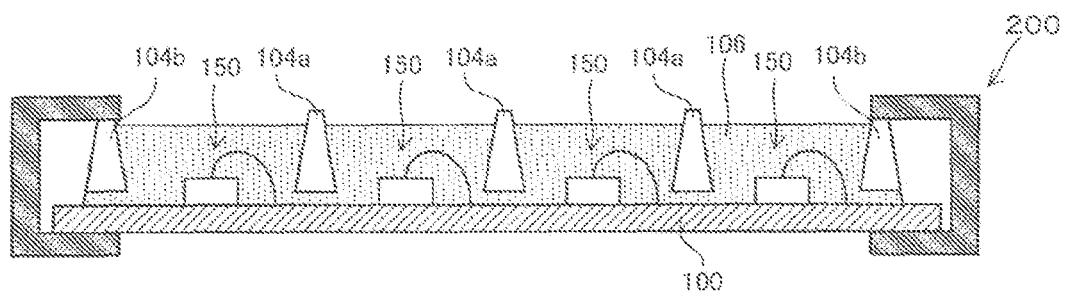

Next, a manufacturing method of the light emitting device 1 having the configuration described above will be described below. FIGS. 3A to 3C are cross-sectional views at production steps of the light emitting device 1 according to the embodiment of the present invention. First, the substrate 100 having desired conductor lines formed thereon is prepared. After a bonding material such as adhesive or solder is applied onto the LED chip mounting positions on the substrate 100, the LED chips 102 are mounted. After the bonding material is cured, electrode pads provided on the LED chips 102 and the conductor lines provided on the substrate 100 are connected with bonding wires 103 (FIG. 3A).

Then, the reflector 104 is supported apart from the substrate 100 and kept in a predetermined relative position relationship with the substrate 100 having the LED chips 102 mounted thereon. That is, the reflector 104 is supported at such a relative position that the reflector 104 is in noncontact with the substrate 100, that the LED chips 102 are respectively housed inside the openings 105, and that the partition wall portion 104a separates the LED chips 102. Thus, the spaces 110 are formed between the reflector 104 and the substrate 100 (FIG. 3B).

Figure 4:
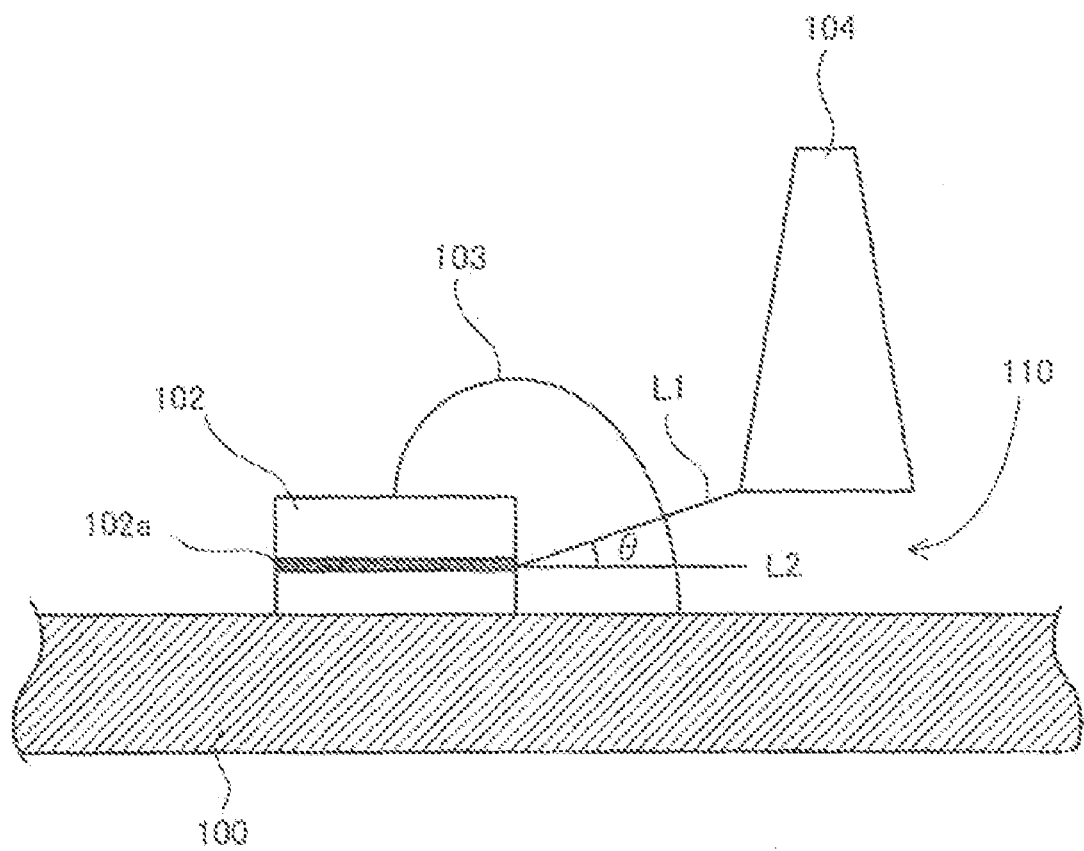
FIG. 4 is a cross-sectional view showing a position relationship between the reflector and a light emitting element forming part of the light emitting device that is the embodiment of the present invention.

The space 110 between the substrate 100 and the reflector 104 should be secured to have such a width that at least the space can be filled with the encapsulating resin 106, and is set as needed according to the viscosity of the encapsulating resin 106 and the size or the like of filler such as a fluorescence substance contained in the encapsulating resin 106. If the width of the space 110 is too large, the amount of light that is not reflected by the reflector 104 but passes through the space 110 will be increased, and thus it may become difficult to obtain desired light distribution. In order to make the reflector 104 sufficiently achieve its function, the width of the space 110 is preferably set such that, in the cross-section shown in FIG. 4, the angle $\theta$ made by a straight line L1 drawn from a light emitting layer 102a of the LED chip 102 to a bottom end of the reflector 104 and an extension line L2 of the light emitting layer 102a is 20 degrees or less.

A support member 200 as shown in FIG. 3B may be used as means for supporting the reflector 104 to be in noncontact with the substrate 100. The support member 200 comprises, for example, a substrate support 200a supporting the substrate 100, a reflector support 200b supporting the reflector 104, and a linking portion 200c linking the substrate support 200a and the reflector support 200b. The substrate 100 is mounted on a support surface of the substrate support 200a and chucked by a vacuum sucking mechanism or the like as needed. The reflector 104 is held at the top of the outer edge portion 104b by a holding mechanism of the reflector support 200b. Also, the reflector 104 is chucked by the reflector support 200b as needed.

Figure 5A:
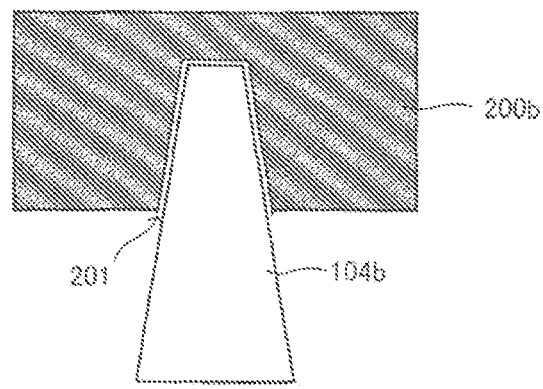
FIGS. 5A to 5C are cross-sectional views showing the configurations of holding mechanisms of a support member used in the production process for the light emitting device according to the embodiment of the present invention.
Figure 5B:
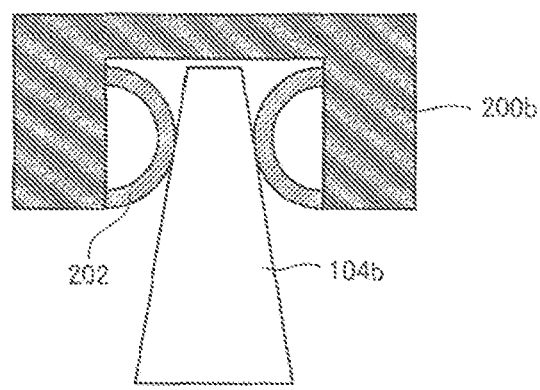
Figure 5C:
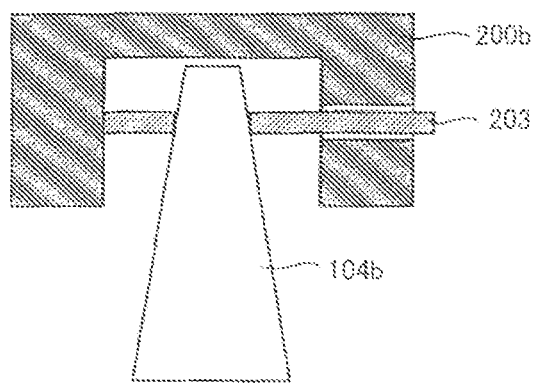

FIGS. 5A to 5C are cross-sectional views showing the configurations of holding mechanisms provided for the reflector support 200b. The holding mechanism can be constituted by, e.g., a hole 201 into which the top of the outer edge portion 104b of the reflector 104 can be fitted as shown in FIG. 5A. Or, as shown in FIG. 5B, the holding mechanism can be constituted by a pair of springs 202 biasing or urging inward to hold the top of the outer edge portion 104b. Or, as shown in FIG. 5C, the holding mechanism can be constituted by a pair of plungers 203 provided to be straightly movable in such a direction as to sandwich the top of the outer edge portion 104b therebetween. Because the linking portion 200c can be extended and contracted, the distance between the substrate 100 and the reflector 104 can be set arbitrarily.

Then, with maintaining the relative position relationship between the substrate 100 and the reflector 104, the encapsulating resin 106 made of light-transmissive resin such as epoxy resin, silicone resin, or urethane resin is injected from above to bury the LED chips 102 housed inside the openings 105 of the reflector 104. The injection of the encapsulating resin 106 is performed using, e.g., a dispensing method, and it may be injected from one location or simultaneously from a plurality of locations. The injected encapsulating resin 106 fills the light emitting areas 150 and the spaces 110 between the substrate 100 and the reflector 104. Because adjacent ones of the light emitting areas 150 are communicating with each other via the space 110, even if being injected from one location, the encapsulating resin 106 spreads to each light emitting area 150. Then, the encapsulating resin 106 is cured by performing a thermal process or the like. Thereby, each of the LED chips 102 is encapsulated, and at the same time the reflector 104 is fixed onto the substrate 100 (FIG. 3C).

Thereafter, the substrate 100 is divided by dicing along predetermined dicing lines as needed. The dicing lines are provided along the partition wall portion 104a of the reflector 104 formed like a lattice. The light emitting device 1 produced by undergoing the above steps may be planar or linear, including a plurality of light emitting areas 150 defined by the partition wall portion 104a of the reflector 104, or the light emitting device 1 may include only one light emitting area 150. Note that one or more LED chips 102 may be included in one light emitting area 150.

Figure 6A:
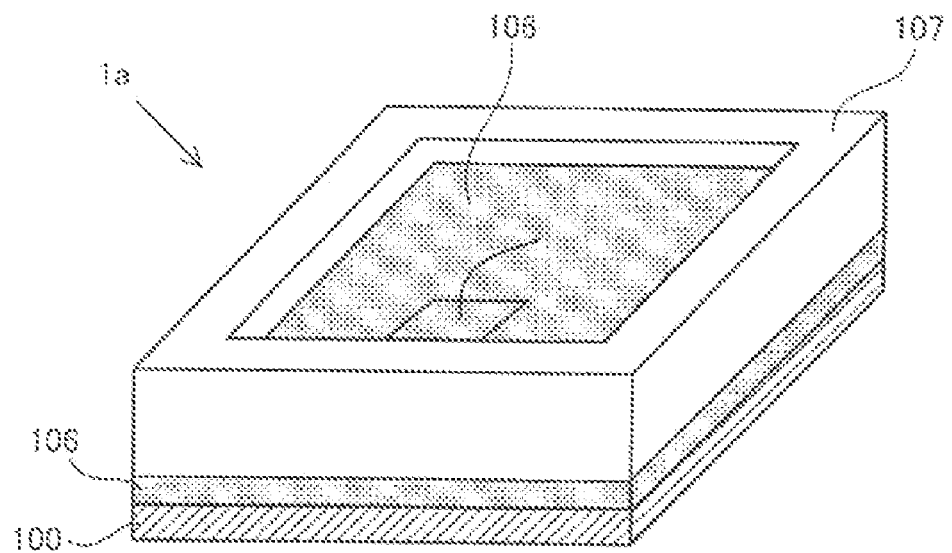
FIG. 6A is a perspective view showing the configuration of a light emitting device having only one light emitting area according to the embodiment of the present invention.
Figure 6B:
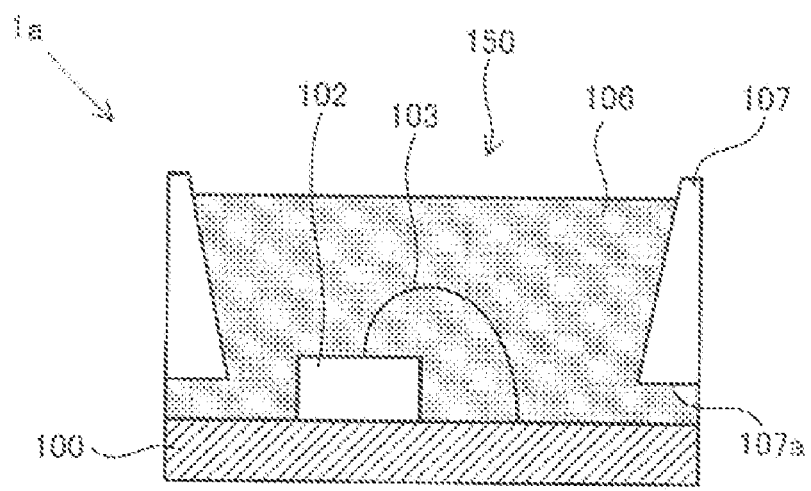
FIG. 6B is a cross-sectional view thereof.

FIG. 6A is a perspective view showing the configuration of a light emitting device 1a having only one light emitting area 150, and FIG. 6B is a cross-sectional view thereof. An LED chip 102 is mounted on the substrate 100 and buried in encapsulating resin 106. Side walls 107 are provided on the side surfaces of the encapsulating resin 106 so as to surround the light emitting element 102. Part of the side surface of the encapsulating resin 106 on the substrate 100 side is not covered by the side wall 107 but exposed to the outside. In other word, the side wall 107 is separated at its entire bottom by a space from the substrate 100 so as not to be in contact with the substrate 100, and the space between the bottom 107a of the side wall 107 and the substrate 100 is filled with the encapsulating resin 106. The encapsulating resin 106 is formed so as to integrally, continuously fill the light emitting area 150 and the space between the bottom 107a of the side wall 107 and the substrate 100 without producing any interface therein. The encapsulating resin 106 may contain a fluorescence substance or a scattering material. Further, a plurality of LED chips may be mounted on the substrate 100. Yet further, the side walls 107 may be ones which serves as a reflector because their surfaces facing the LED chip 102 are light-reflective, or may be constituted by a light non-reflective member.

The light emitting device 1a having the above-described configuration that has only one light emitting area 150 can be produced by dicing the light emitting device 1 including a plurality of light emitting areas 150 into separate devices as mentioned above. Instead of this manufacturing method, the light emitting device 1a may be individually produced in compliance with the manufacturing method described in the embodiment.

Specifically, an LED chip 102 is mounted on the substrate 100. Then, by performing wire bonding or the like as needed, the anode and the cathode electrode of the LED chip 102 are electrically connected to conductor lines on the substrate 100. Then, the side walls 107 are supported apart from the substrate 100 to surround the LED chip 102 mounted on the substrate 100. In other words, the side walls 107 are supported in noncontact with the substrate 100. Then, with maintaining the relative position relationship between the side walls 107 and the substrate 100, the encapsulating resin 106 is injected from above to bury the LED chip 102 surrounded by the side walls 107. The injected encapsulating resin 106 fills the light emitting area 150 and the space between the substrate 100 and the side walls 107. Then, the encapsulating resin 106 is cured by performing a thermal process or the like. Thereby, the LED chip 102 is encapsulated, and at the same time the side walls 107 are fixed onto the substrate 100, finishing the light emitting device 1a including a single light emitting area 150.

With the configuration and manufacturing method of the light emitting device according to the embodiment of the present invention described above, the following effects can be obtained.

That is, because the process of fixing the reflector 104 onto the substrate 100 and the encapsulating process are performed in one step, a reduction in the number of steps to be managed and shortening production time can be achieved, and thus production cost can be reduced.

Further, with the configuration and manufacturing method of the light emitting device according to the embodiment of the present invention, decreases in reliability and in manufacturing yield due to the variation in the amount of applied adhesive as described previously can be avoided because an adhesive for fixing the reflector 104 need not be used as in the conventional art.

Yet further, with the configuration and manufacturing method of the light emitting device according to the embodiment of the present invention, the space between the reflector 104 and the substrate 100 is filled with the encapsulating resin, and hence the adhesion between the reflector 104 and the substrate 100 is secured, thus improving reliability. If the encapsulating resin is not interposed between the reflector 104 and the substrate 100, and the underside of the reflector 104 is in direct contact with the top of the substrate 100, air will be likely introduced in between the reflector and the substrate, which may cause a problem in terms of reliability and light distribution design.

Still further, with the configuration and manufacturing method of the light emitting device according to the embodiment of the present invention, no interface is formed in the encapsulating resin 106 because the encapsulating resin 106 is formed so as to integrally, continuously fill the light emitting areas 150 and the spaces 110 between the reflector 104 and the substrate 100, no interface of the resin layer is formed in the light emitting areas.

Further, with the configuration and manufacturing method of the light emitting device according to the embodiment of the present invention, because the spaces in the light emitting areas 150 partitioned by the partition wall portion 104a are in communication with each other via the space 110, the height of the encapsulating resin 106 can be made uniform across the light emitting areas. By this means, the problems of chromaticity deviation and color unevenness can be avoided where the encapsulating resin 106 is made to contain a fluorescence substance. Further, the spaces in the light emitting areas are made to communicate with each other by supporting the reflector 104 in noncontact with the substrate 100, and hence occurrences of a portion where stress due to the expansion and contraction of the encapsulating resin 106 concentrates can be reduced. Yet further, in the light emitting device, because the reflector is not stuck to the substrate by any member other than the encapsulating resin, the thermal expansion and contraction of the encapsulating resin can be relaxed, and hence the concentration of stress due to the expansion and contraction of the encapsulating resin can be reduced as compared with where the reflector is stuck to the substrate by another member than the encapsulating resin. Still further, where the light emitting device is configured to have an open region at the side surface of the encapsulating resin, which region is exposed and not covered by the reflector, the concentration of stress in a vertical direction can be alleviated by the open region. In other words, internal stress can be dispersed which occurs when the encapsulating resin 106 expands or contracts due to the process of curing the encapsulating resin 106, variation in the ambient temperature, and so on, and thus the manufacturing yield and reliability of the light emitting device can be improved.

In the case of the structure and manufacturing method described above, the encapsulating resin 106 may leak through the space 110 formed between the outermost edge portion 104b of the reflector and the substrate 100 in the step of injecting the encapsulating resin 106. A second to sixth embodiment below are intended to further prevent resin leakage at the outermost edge portion 104b of the reflector.

Second Embodiment

FIG. 7 is a cross-sectional view showing the configuration of a light emitting device 2 according to a second embodiment of the present invention. In order to prevent resin leakage mentioned above, the light emitting device 2 differs from the light emitting device 1 according to the first embodiment in that the width d1 of the space 110b between the outer edge portion 104b of the reflector 104 and the substrate 100 is smaller than the width d2 of the spaces 110a between the partition wall portion 104a, i.e. the other portion than the outer edge portion 104b, of the reflector 104 and the substrate (d1<d2). As such, by making the width of the space 110b located at the outermost circumference of the light emitting device 2 smaller than the width of the spaces 110a located on the inner circumference side, resin leakage can be prevented while obtaining the fluidity of the encapsulating resin 106 inward of the outer edge portion 104b. The widths d1 and d2 of the spaces should be set as needed according to the viscosity of the encapsulating resin 106 and the size or the like of filler such as a fluorescence substance contained in the encapsulating resin 106. The other constituents are the same as in the light emitting device 1 according to the first embodiment, and hence description thereof is omitted.

Third Embodiment

FIG. 8 is a cross-sectional view showing the configuration of a light emitting device 3 according to a third embodiment of the present invention. In order to prevent resin leakage mentioned above, the light emitting device 3 differs from the light emitting device 1 according to the first embodiment in that the reflector 104 directly contacts the substrate 100 at the outer edge portion 104b, not via encapsulating resin. In other words, there is no space between the outer edge portion 104b of the reflector 104 and the substrate 100. The partition wall portion 104a, i.e. the other portion than the outer edge portion 104b, of the reflector 104 is apart from the substrate 100 as in the light emitting device 1 according to the first embodiment, and the space between them is filled with the encapsulating resin 106. With this configuration, resin leakage can be prevented while obtaining the fluidity of the encapsulating resin 106 inward of the outer edge portion 104b. Also, with this configuration, the reflector is supported by the substrate 100, and hence the support member 200 mentioned above is unnecessary in the step of injecting the encapsulating resin 106. Note that at the step of injecting the encapsulating resin 106, the encapsulating resin 106 may be injected with the reflector 104 being merely placed on but not fixed to the substrate 100, or that after the reflector 104 is fixed at the outer edge portion 104b onto the substrate 100 with use of a seal material or the like, the encapsulating resin 106 may be injected. The other constituents are the same as in the light emitting device 1 according to the first embodiment, and hence description thereof is omitted.

Figure 9A:
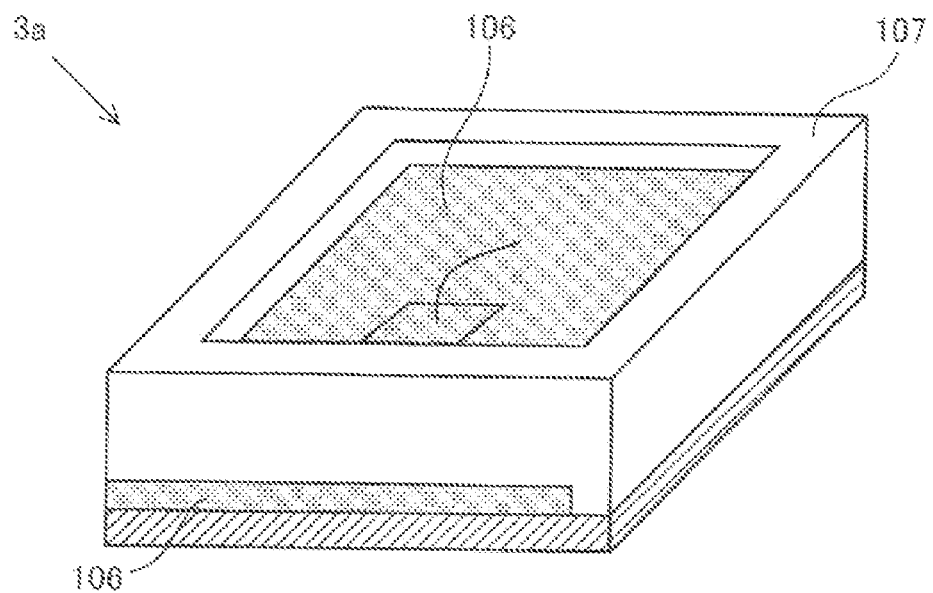
FIG. 9A is a perspective view showing the configuration of a light emitting device having only one light emitting area according to the third embodiment of the present invention.
Figure 9B:
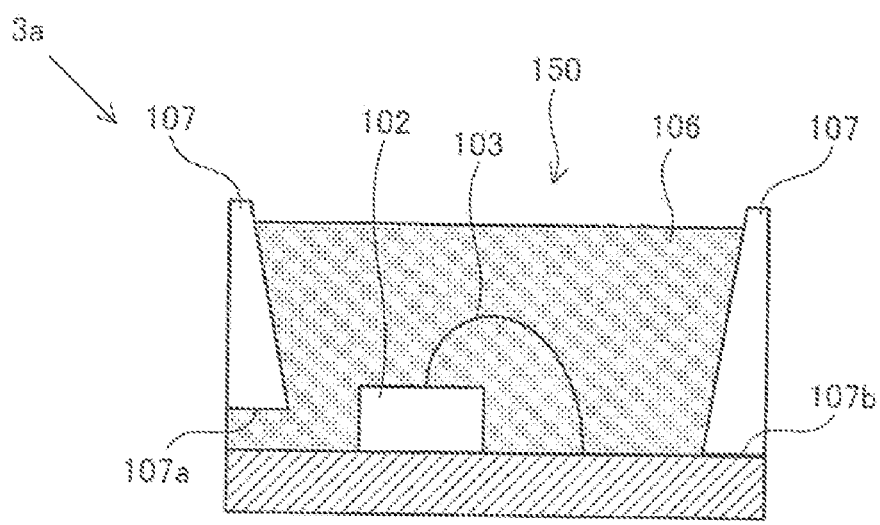
FIG. 9B is a cross-sectional view thereof.

The light emitting device according to the embodiment may be one which includes only one light emitting area 150. FIG. 9A is a perspective view showing the configuration of a light emitting device 3a having a single light emitting area 150, and FIG. 9B is a cross-sectional view thereof. The light emitting device 3a may include a portion of the outer edge portion 104b of the reflector as a side wall 107 as shown in the figure. Side walls 107 are formed on the side surfaces of encapsulating resin 106 covering an LED chip 102 mounted on the substrate 100. The bottom 107a of side walls 107 corresponding to the partition wall portion 104a of the reflector is in contact with the encapsulating resin 106, and the space between the bottom 107a of the side walls 107 and the substrate 100 is filled with the encapsulating resin 106. Where a portion of the outer edge portion 104b of the reflector is used as a side wall 107 of the light emitting device, the bottom 107b of a side wall 107 corresponding to the outer edge portion 104b is preferably in contact with the substrate but not joined together, or forms a slight space in between. That is, at least part of the side surfaces of the encapsulating resin 106 on the substrate 100 side is not covered by the side wall 107 but exposed to the outside. The light emitting device 3a having this configuration can be produced by dicing the light emitting device 3 including a plurality of light emitting areas along dicing lines extending along the partition wall portion 104a through the substrate 100 into chips.

Forth Embodiment

Figure 10:
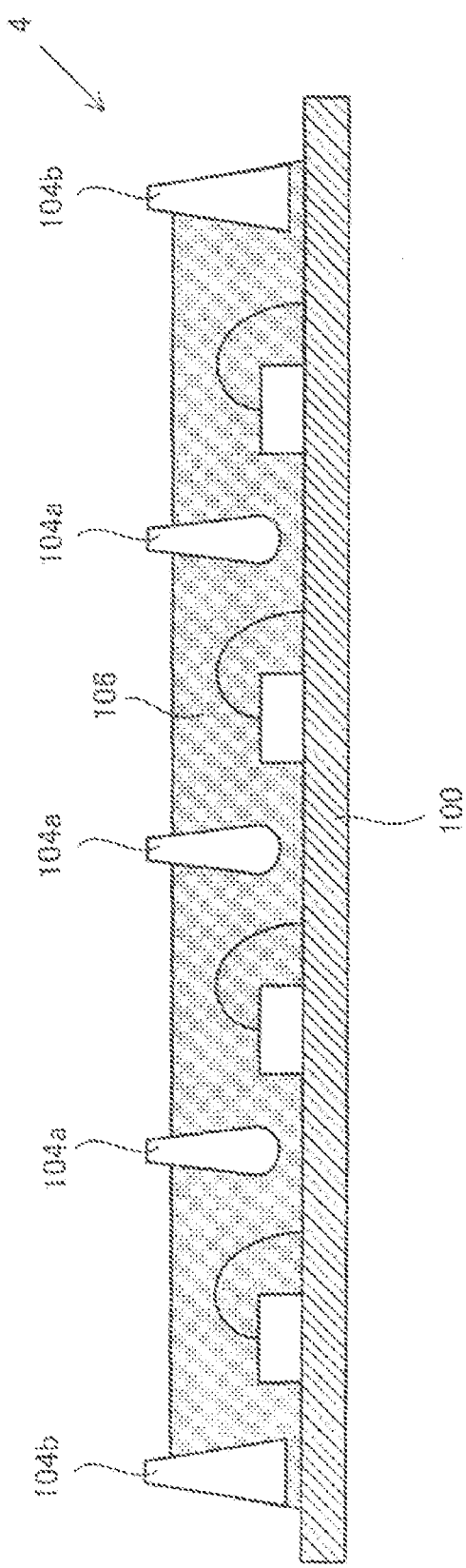
FIG. 10 is a cross-sectional view showing the configuration of a light emitting device according to a fourth embodiment of the present invention.

FIG. 10 is a cross-sectional view showing the configuration of a light emitting device 4 according to a forth embodiment of the present invention. In the light emitting device 4 the bottom of the partition wall portion 104a of the reflector 104 is different in shape from the bottom of the outer edge portion 104b in order to prevent resin leakage mentioned above. Chamfering or rounding processing has been performed on the bottom of the partition wall portion 104a of the reflector 104 to have an outward curved shape or convex shape with respect to the substrate 100. As such, by making the bottom of the partition wall portion 104a have a round shape in cross-section, the flow passage for the encapsulating resin 106 is expanded to increase the fluidity of the encapsulating resin. Meanwhile, the outer edge portion 104b of the reflector 104 does not have such a shape for increasing the fluidity of the encapsulating resin, and resin leakage is prevented by adjusting the width of the space 110b and the viscosity of the encapsulating resin. The bottom of the partition wall portion 104a may take on any shape, not being limited to a semicircle shape, as long as the flow passage for the encapsulating resin is expanded by the use of the shape. The other constituents are the same as in the light emitting device 1 according to the embodiment 1, and hence description thereof is omitted.

Fifth Embodiment

Figure 11:
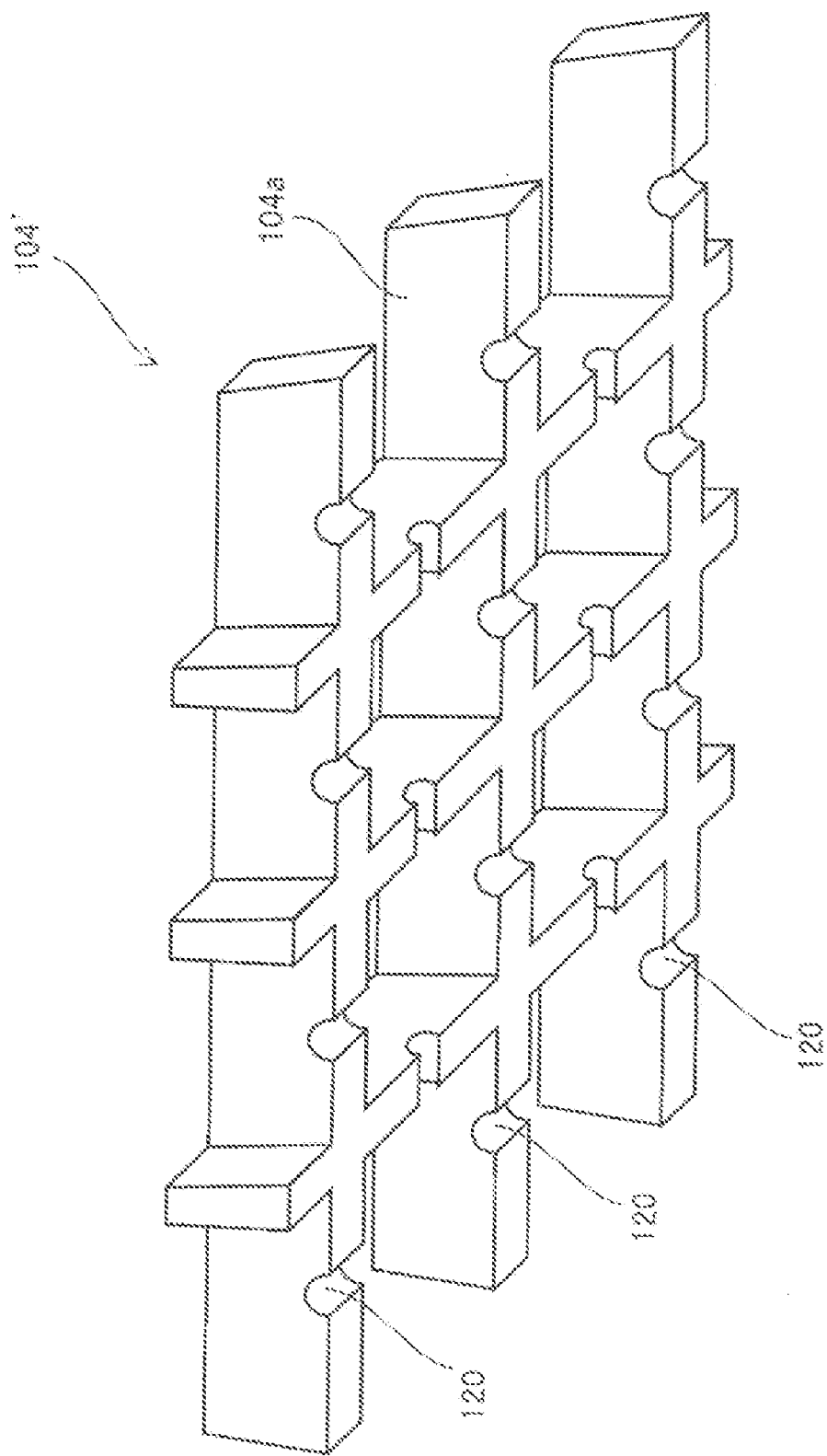
FIG. 11 is a perspective view showing the configuration of a reflector forming part of a light emitting device according to a fifth embodiment of the present invention.

FIG. 11 is a perspective view showing the structure of a reflector 104' forming part of a light emitting device according to a fifth embodiment of the present invention. In the reflector 104', notches 120 are made in the bottom of a partition wall portion 104a separating adjacent light emitting areas 150. By this means, the flow passage for the encapsulating resin 106 is expanded to increase the fluidity of the encapsulating resin 106. The outer edge portion 104b of the reflector 104 does not have such notches, and resin leakage is prevented by adjusting the width of the space 110b and the viscosity of the encapsulating resin. The notches 120 may take on any shape such as a semicircle shape or a rectangular shape. Or, as to a configuration to expand the flow passage for the encapsulating resin, instead of forming notches, through holes through which the encapsulating resin 106 can flow may be made in the partition wall portion 104a at a middle position in a height direction. The other configurations are the same as in the light emitting device according to the first embodiment, and hence description thereof is omitted.

Sixth Embodiment

Figure 12:
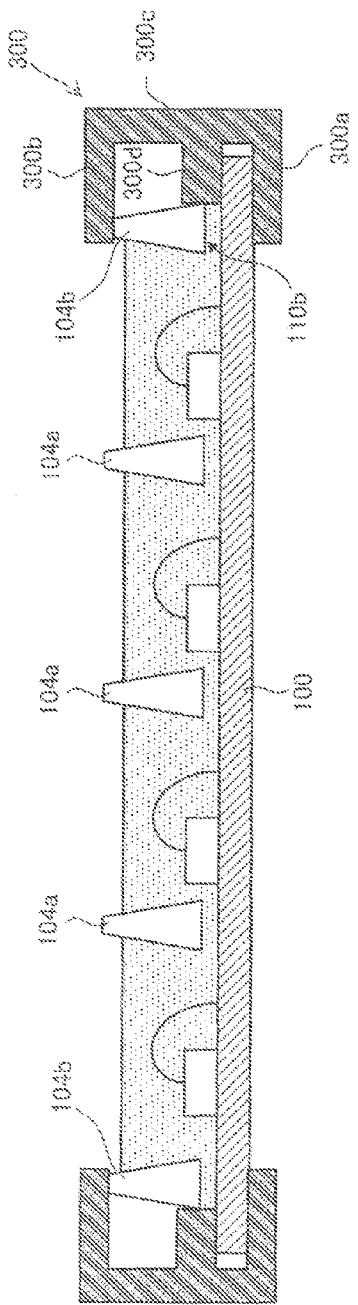
FIG. 12 is a cross-sectional view showing a production step of a light emitting device according to a sixth embodiment of the present invention.

A sixth embodiment of the present invention relates to a manufacturing method of the light emitting device. FIG. 12 is a cross-sectional view showing the step of injecting the encapsulating resin 106. With the reflector 104 being supported in noncontact with the substrate 100 by a support member 300, the encapsulating resin 106 is injected as in the production process according to the first embodiment described above. The manufacturing method according to the present embodiment differs from that of the first embodiment in the structure of the support member 300. That is, the support member 300 is provided not only with a substrate support 300a, a reflector support 300b, and a linking portion 300c but also with a sealing portion 300d sealing an end of the space 110b formed between the outer edge portion 104b and the substrate 100 when the reflector 104 is supported. By this means, resin leakage from the space 110b at the outermost circumference of the light emitting device can be prevented. Note that a mold release agent is preferably applied to the surface contacting the light emitting device of the sealing portion 300d.

Seventh Embodiment

Figure 13:
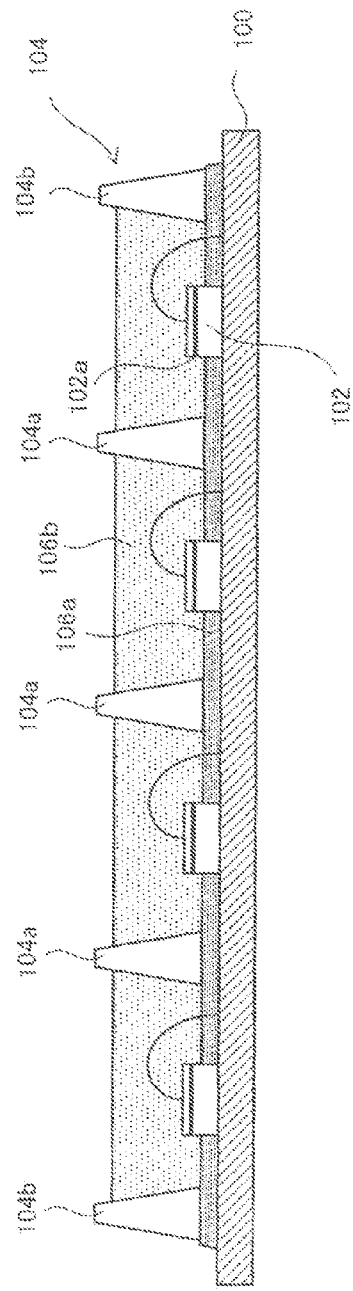
FIG. 13 is a cross-sectional view showing the configuration of a light emitting device according to seventh embodiment of the present invention.

Embodiment 7 of the present invention will be described below. FIG. 13 is a cross-sectional view showing the configuration of a light emitting device 7 according to a seventh embodiment of the present invention. The light emitting device 7 differs from the light emitting device 1 according to the first embodiment in that the encapsulating resin 106 has a laminated structure of two resin layers.

That is, the encapsulating resin 106 is composed of a first resin layer 106a covering the lower portion of the light emitting area and a second resin layer 106b covering the upper portion of the light emitting area. The first resin layer 106a is made of a light-reflective material such as silicone resin or epoxy resin made to contain $TiO_2$ or the like. The first resin layer 106a is formed to have such a thickness that its top is below the height position of the light emitting layer 102a of the LED chip 102. The spaces between the reflector 104 and the substrate 100 are preferably filled with the first resin layer 106a. The second resin layer 106b is made of light-transmissive resin such as epoxy resin, silicone resin, or urethane resin, and is laid over the first resin layer 106a to bury the LED chip 102 in each light emitting area.

The other configurations than the encapsulating resin are the same as in the light emitting device 1 according to the first embodiment, and hence description thereof is omitted.

As such, the encapsulating resin 106 may have a laminated structure of a plurality of resin layers, one of which may have a function as a light-reflective layer. With the light emitting device according to the seventh embodiment, because the light-reflective layer is formed below the height position of the light emitting layer 102a of the LED chip 102, lateral light leakage can be prevented, and thus the amount of light emitted in a forward projecting direction can be increased.

Although the embodiments of the present invention have been described above, this invention is not limited to these, and the configurations of the light emitting devices described in the above embodiments can be combined as needed, or various modifications can be made thereto. For example, while the above embodiments are configured such that a light-reflective reflector is used as a side wall structure to define each of the light emitting areas, each of the light emitting areas 150 may be defined by a side wall structure constituted by another member that is not light-reflective.

The present invention has been described above with reference to preferred embodiments. It should be understood that those skilled in the art can think of various modifications and changes and that all variations made by those modifications and changes fall within the scope of the present invention as defined by the appended claims.

This application is based on Japanese Patent Application No. 2009-145254 which is herein incorporated by reference.

What is claimed is:

1. A manufacturing method of a light emitting device comprising:
    a mounting step of mounting a plurality of light emitting elements on a substrate;
    a supporting step of supporting a side wall structure having a partition wall portion separating a plurality of light emitting areas at a predetermined relative position with respect to said substrate, each of said plurality of light emitting areas including at least one of said light emitting elements; and
    an encapsulating step of injecting encapsulating resin into said light emitting areas defined by said side wall structure to encapsulate said light emitting elements therein and to fix said side wall structure onto said substrate,
    wherein, in said supporting step, said side wall structure is supported such that said partition wall portion is separated by a space from said substrate, and
    wherein, in said encapsulating step, said encapsulating resin is injected to fill said space between said partition wall portion and said substrate, and each of said light emitting areas.

2. A manufacturing method of a light emitting device according to claim 1, wherein in said supporting step, said side wall structure is supported such that both said partition wall portion and an outer edge portion provided at the periphery of said plurality of light emitting areas are separated by spaces from said substrate.

3. A manufacturing method of a light emitting device according to claim 1, wherein in said supporting step, said side wall structure is supported such that an outer edge portion thereof provided at the periphery of said plurality of light emitting areas contacts said substrate.

4. A manufacturing method of a light emitting device according to claim 2, wherein, in said injecting step, said encapsulating resin is injected so as to seal an end portion of the space between said outer edge portion and said substrate.

5. A manufacturing method of a light emitting device according to claim 1, further comprising:
    a dividing step of, after said encapsulating step, dicing along dicing lines extending along said partition wall portion.

6. A manufacturing method of a light emitting device comprising:
    a mounting step of mounting a light emitting element on a substrate;
    a step of supporting a side wall structure that surrounds said light emitting element to be separated by a space from said substrate; and
    a step of injecting encapsulating resin into the inside of said side wall structure so as to cover said light emitting element and to fill said space between the bottom of said side wall structure and said substrate and curing the resin.

* * * * *